(12) United States Patent
Choi et al.

(10) Patent No.: US 12,309,480 B2
(45) Date of Patent: May 20, 2025

(54) CAMERA MODULE

(71) Applicant: LG INNOTEK CO., LTD., Seoul (KR)

(72) Inventors: Jong Cheol Choi, Seoul (KR); Ohk Sung Kim, Seoul (KR); Seong Deok Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 84 days.

(21) Appl. No.: 18/009,544

(22) PCT Filed: Jun. 8, 2021

(86) PCT No.: PCT/KR2021/007170
§ 371 (c)(1),
(2) Date: Dec. 9, 2022

(87) PCT Pub. No.: WO2021/251732
PCT Pub. Date: Dec. 16, 2021

(65) Prior Publication Data
US 2023/0239561 A1  Jul. 27, 2023

(30) Foreign Application Priority Data

Jun. 12, 2020 (KR) ........................ 10-2020-0071622

(51) Int. Cl.
*H04N 23/57* (2023.01)
*G03B 17/12* (2021.01)
(Continued)

(52) U.S. Cl.
CPC ............. *H04N 23/57* (2023.01); *G03B 17/12* (2013.01); *G03B 17/55* (2013.01); *H05K 7/20436* (2013.01)

(58) Field of Classification Search
CPC ........ H04N 23/57; G03B 17/12; G03B 17/55; H05K 7/20436
(Continued)

(56) References Cited

U.S. PATENT DOCUMENTS

2007/0081309 A1* 4/2007 Urushibara ............ H05K 1/147
361/748
2010/0185052 A1 7/2010 Chang
(Continued)

FOREIGN PATENT DOCUMENTS

DE  10 2013 108 677 A1  2/2015
EP   3 531 681 A1       8/2019
(Continued)

*Primary Examiner* — Joel W Fosselman
(74) *Attorney, Agent, or Firm* — Birch, Stewart, Kolasch & Birch, LLP

(57) ABSTRACT

The present invention relates to a camera module comprising: a first body including a lens; a second body coupled to the first body; and a substrate assembly disposed within the second body, wherein the substrate assembly comprises: a first substrate and a second substrate; a third substrate disposed between the first substrate and the second substrate; a fourth substrate electrically connecting the first substrate and the second substrate; a fifth substrate electrically connecting the second substrate and the third substrate; and a processor disposed on the second substrate, wherein the length of the fourth substrate is longer than the length of the fifth substrate.

18 Claims, 12 Drawing Sheets

(51) Int. Cl.
*G03B 17/55* (2021.01)
*H05K 7/20* (2006.01)

(58) Field of Classification Search
USPC .......................................................... 348/374
See application file for complete search history.

(56) References Cited

U.S. PATENT DOCUMENTS

2014/0255016 A1   9/2014  Kim et al.
2015/0365569 A1  12/2015  Mai et al.
2017/0293199 A1  10/2017  Kim et al.
2019/0208091 A1   7/2019  Mleczko et al.
2019/0364661 A1  11/2019  Govrin et al.

FOREIGN PATENT DOCUMENTS

| KR | 10-2007-0116434 A | 12/2007 |
| KR | 10-2011-0057634 A | 6/2011 |
| KR | 10-2014-0118577 A | 10/2014 |
| KR | 10-2017-0115372 A | 10/2017 |
| KR | 10-2018-0090451 A | 8/2018 |
| WO | WO 2017/122971 A1 | 7/2017 |

\* cited by examiner

CAMERA MODULE

CROSS REFERENCE TO RELATED APPLICATIONS

This application is the National Phase of PCT International Application No. PCT/KR2021/007170, filed on Jun. 8, 2021, which claims priority under 35 U.S.C. 119(a) to Patent Application No. 10-2020-0071622, filed in the Republic of Korea on Jun. 12, 2020, all of which are hereby expressly incorporated by reference into the present application.

TECHNICAL FIELD

The present embodiment relates to a camera module.

BACKGROUND ART

Recently, ultra-small camera modules are being developed, and ultra-small camera modules are widely used in small electronic products such as smartphones, laptops, and game consoles.

As the spread of automobiles becomes more popular, ultra-small cameras are widely used not only in small electronic products but also in vehicles. For example, black box cameras for vehicle protection or objective data of traffic accidents, rear surveillance cameras that allow drivers to monitor blind spots at the rear of the vehicle through screens to ensure safety when reversing the vehicle, and peripheral detection cameras capable of monitoring the surroundings of the vehicle, and the like are provided.

Recently, as the camera module outputs high-resolution images, the number of substrates is increasing, and the size and number of elements being mounted on the substrate are increasing. At this time, there is a problem with the heat dissipation structure that emits heat to the outside as the heat inside the camera module is increasing due to the increase in the amount of heat generated from the substrate or element being mounted on the substrate.

In particular, the conventional camera module is designed to position the ISP processor generating the highest amount of heat on the second stacked substrate, and in this case, it is difficult to design a structure that can contact the ISP processor and the metal body with high thermal conductivity, so there is a problem that only natural heat dissipation can be done by the internal air.

In addition, since only natural heat dissipation is possible, there is a problem of malfunction such as the camera module being suddenly turned off due to an increase in internal temperature.

DETAILED DESCRIPTION OF THE INVENTION

Technical Subject

Through this embodiment, it is intended to provide a camera module with improved heat dissipation performance by changing the assembly stack structure of a substrate and disposing the processor close to a metal body.

In addition, it is intended to provide a camera module having a substrate structure advantageous for heat dissipation by contacting a processor with a component having high thermal conductivity by changing the assembly stacking structure of the substrate.

Technical Solution

A camera module according to the present embodiment comprises: a first body including a lens; a second body being coupled to the first body; and a substrate assembly being disposed inside the second body, wherein the substrate assembly comprises: a first substrate and a second substrate; a third substrate being disposed between the first substrate and the second substrate; a fourth substrate electrically connecting the first substrate and the second substrate; a fifth substrate electrically connecting the second substrate and the third substrate; and a processor being disposed on the second substrate, and wherein the length of the fourth substrate may be longer than the length of the fifth substrate.

A camera module according to the present embodiment comprises: a first body including a lens; a second body being coupled to the first body; and a substrate assembly disposed inside the second body, wherein the substrate assembly comprises: a first substrate and a second substrate; a third substrate being disposed between the first substrate and the second substrate; a fourth substrate electrically connecting the first substrate and the second substrate; a fifth substrate electrically connecting the second substrate and the third substrate; and a processor being disposed on the second substrate, and wherein the length of the fourth substrate in an optical axis direction may be longer than the length of the fifth substrate in the optical axis direction.

The processor may be disposed closer to a bottom plate of the second body than the first to fifth substrates.

At least a portion of the fourth substrate may be overlapped with the second substrate in a direction perpendicular to the optical axis direction.

The fourth substrate may be overlapped with the fifth substrate in a direction perpendicular to the optical axis direction.

A connector being disposed on the third substrate is included, and the second substrate may include a groove through which the connector is being penetrated.

At least a portion of the connector may be overlapped with the second substrate in a direction perpendicular to the optical axis direction.

At least a portion of the connector is disposed at a position higher than the second substrate, and the remaining portion of the connector may be disposed at a position lower than the second substrate.

The distance between the first substrate and the second substrate in an optical axis direction may be longer than the distance between the first substrate and the third substrate in the optical axis direction.

The second body includes a bottom plate, a side plate being extended upwardly from the bottom plate, and a heat dissipation pad being disposed between the processor and the bottom plate of the second body, wherein one surface of the heat dissipation pad is in contact with the processor and the other surface of the heat dissipation pad may be in contact with the bottom plate of the second body.

The heat dissipation pad may be formed of a thermally conductive material.

The thickness of the heat dissipation pad in an optical axis direction may be greater than a thickness of the processor in the optical axis direction.

The heat being generated in the processor may be transferred to the heat dissipation pad, and the heat transferred to the heat dissipation pad may be radiated to the outside through the bottom plate of the second body.

The width of the fourth substrate in a direction perpendicular to an optical axis direction may be smaller than the width of the fifth substrate in a direction perpendicular to the optical axis direction.

The first to third substrates includes a rigid printed circuit board, and the fourth to fifth substrates may include a rigid printed circuit board.

The camera module according to the present embodiment comprises: a first body including a lens; a second body being coupled to the first body; and a substrate assembly being disposed inside the second body, wherein the substrate assembly comprises: a first substrate being disposed with an image sensor; a second substrate being spaced apart from the first substrate and being disposed with a processor; and a third substrate being spaced apart from the first and second substrates and being disposed with a connector, and wherein the second substrate may be disposed farther from the lens than the first and third substrates.

The second substrate may be disposed at a lower position than the first and third substrates.

The third substrate may be disposed between the first substrate and the third substrate, and the second substrate may include a groove through which the connector is penetrated.

At least a portion of the connector is disposed at a position higher than the second substrate, and the remaining portion of the connector may be disposed at a position lower than the second substrate.

The distance between the first substrate and the second substrate in an optical axis direction may be longer than the distance between the first substrate and the third substrate in the optical axis direction.

A fourth substrate electrically connecting the first substrate and the second substrate, and a fifth substrate electrically connecting the second substrate and the third substrate are included, and the length of the fourth substrate in an optical axis direction may be longer than the length of the fifth substrate in the optical axis direction.

At least a portion of the fourth substrate may be overlapped with the second substrate in a direction perpendicular to the optical axis direction.

Advantageous Effects

Through the present embodiment, the heat dissipation performance may be improved by changing the assembly stacking structure of the substrate and disposing the processor close to the metal body.

In addition, by changing the assembly and stacking structure of the substrate, the processor may have a substrate structure advantageous for heat dissipation by being contacted with the component with high thermal conductivity.

EMBODIMENT

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

The 'optical axis direction' used hereinafter may be defined as an optical axis direction of the lens. Meanwhile, the 'optical axis direction' may correspond to any one among a 'up and down direction', a 'vertical direction', and a 'z axis direction'.

Hereinafter, the camera module 10 according to an embodiment of the present invention will be described in more detail with reference to the accompanying drawings.

Figure 1:
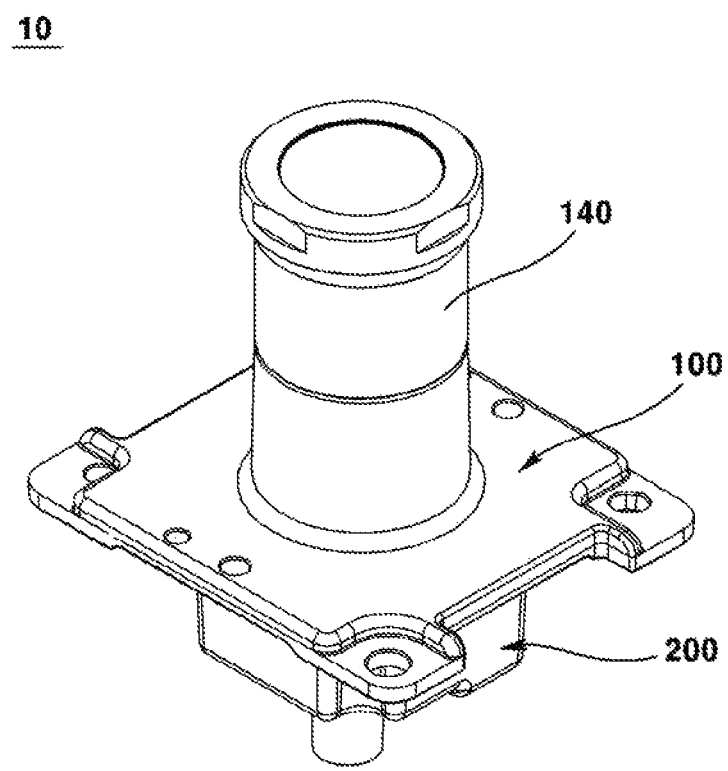
FIG. 1 is a perspective view of a camera module according to the present embodiment when viewed from an upward direction.
Figure 2:
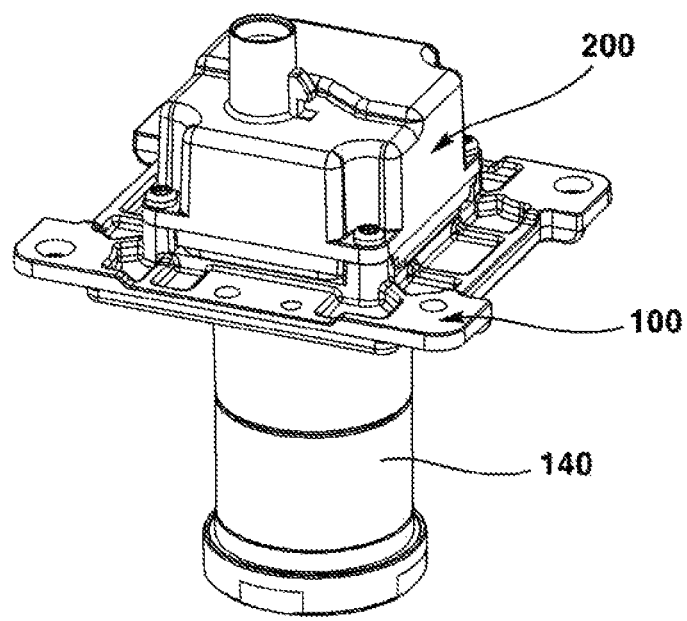
FIG. 2 is a perspective view of the camera module according to the present embodiment when viewed from a downward direction.
Figure 3:
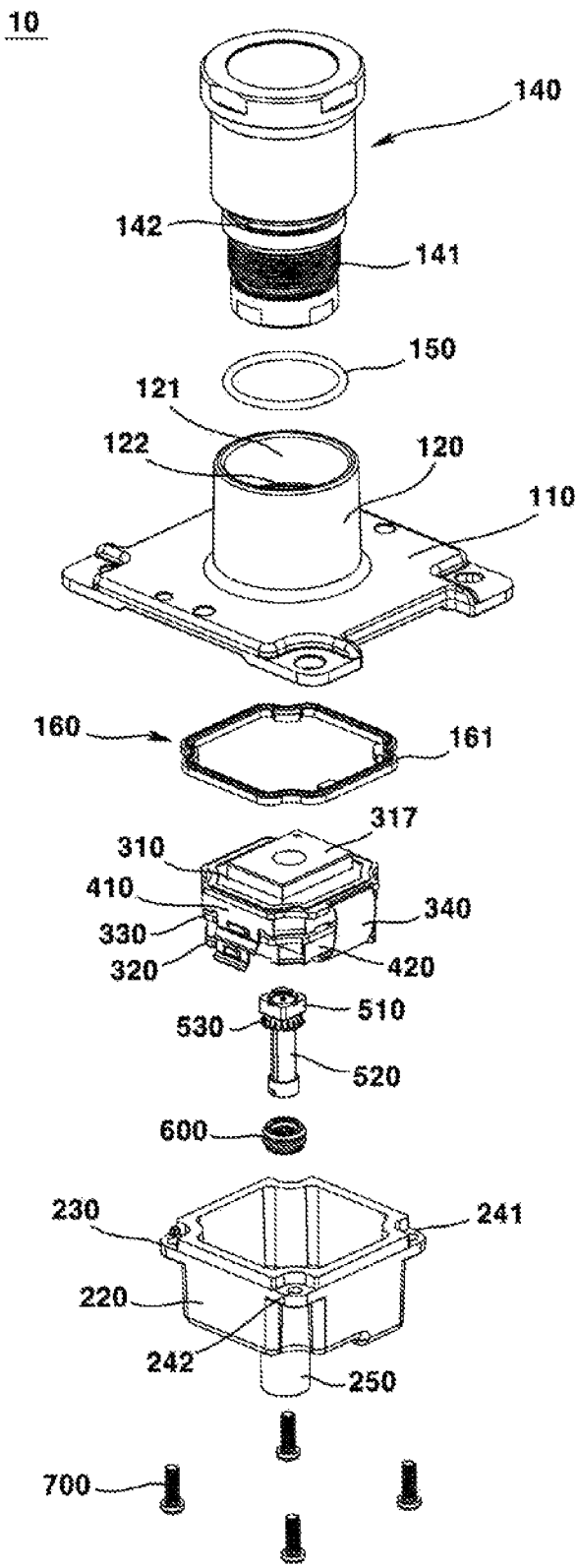
FIG. 3 is an exploded perspective view of FIG. 1.
Figure 4:
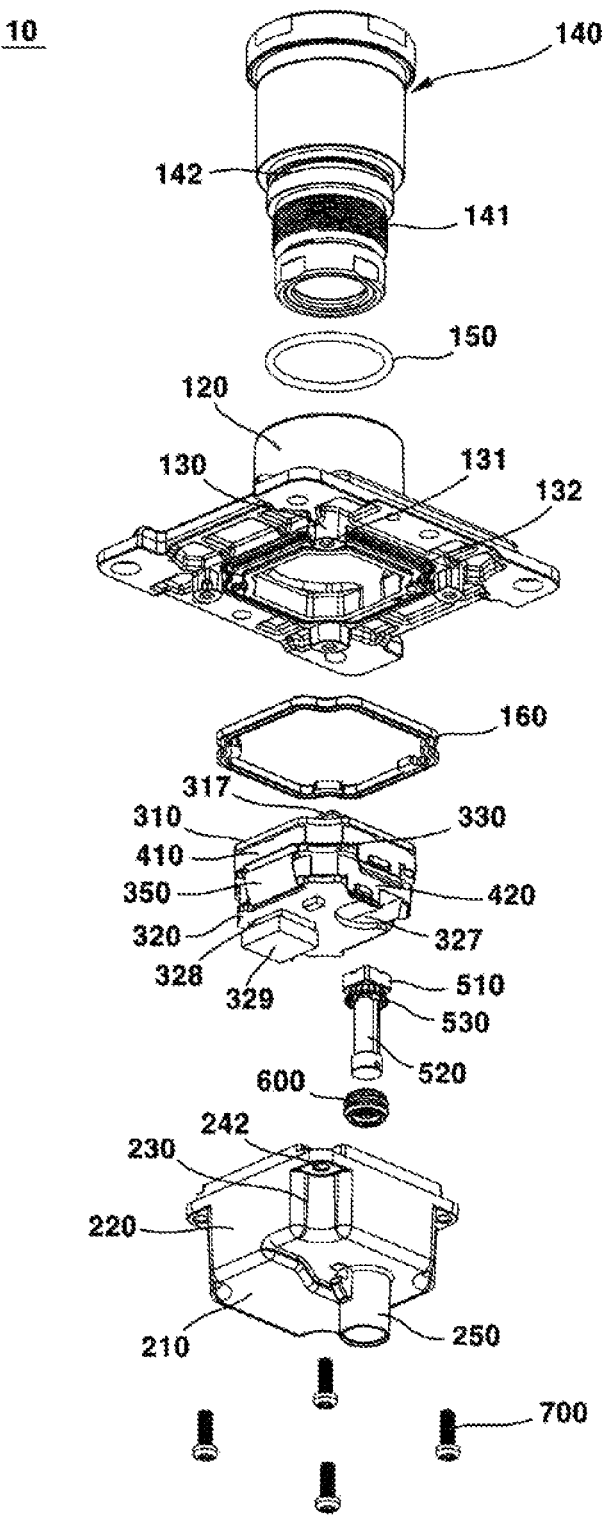
FIG. 4 is an exploded perspective view of FIG. 2.
Figure 5:
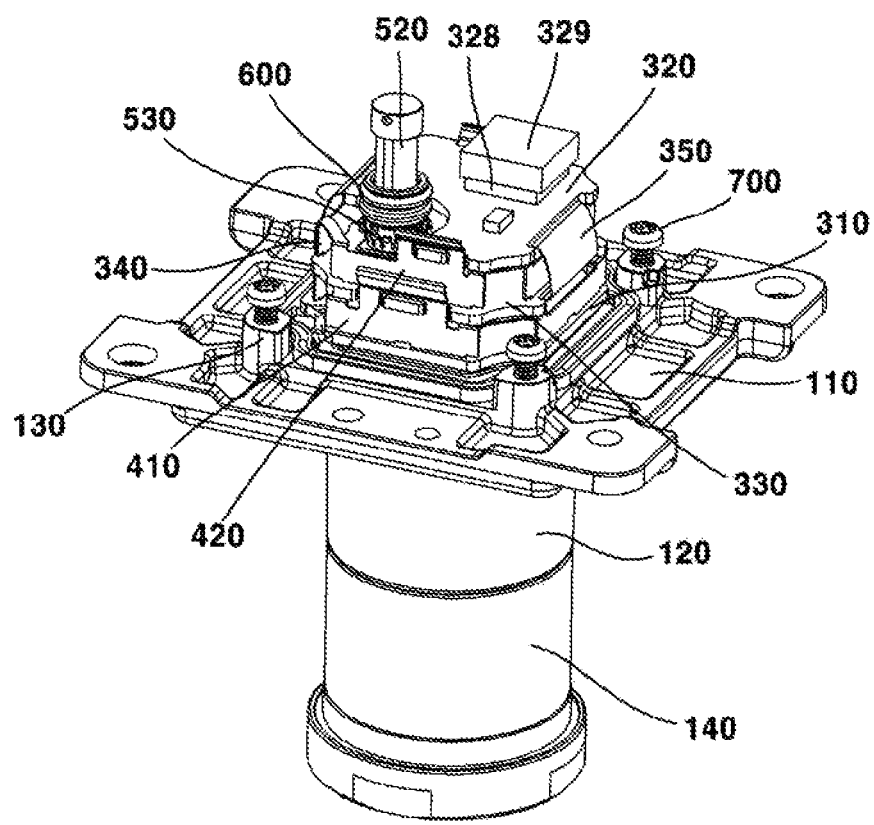
FIG. 5 is a perspective view with a second body of a camera module being removed according to the present embodiment.
Figure 6:
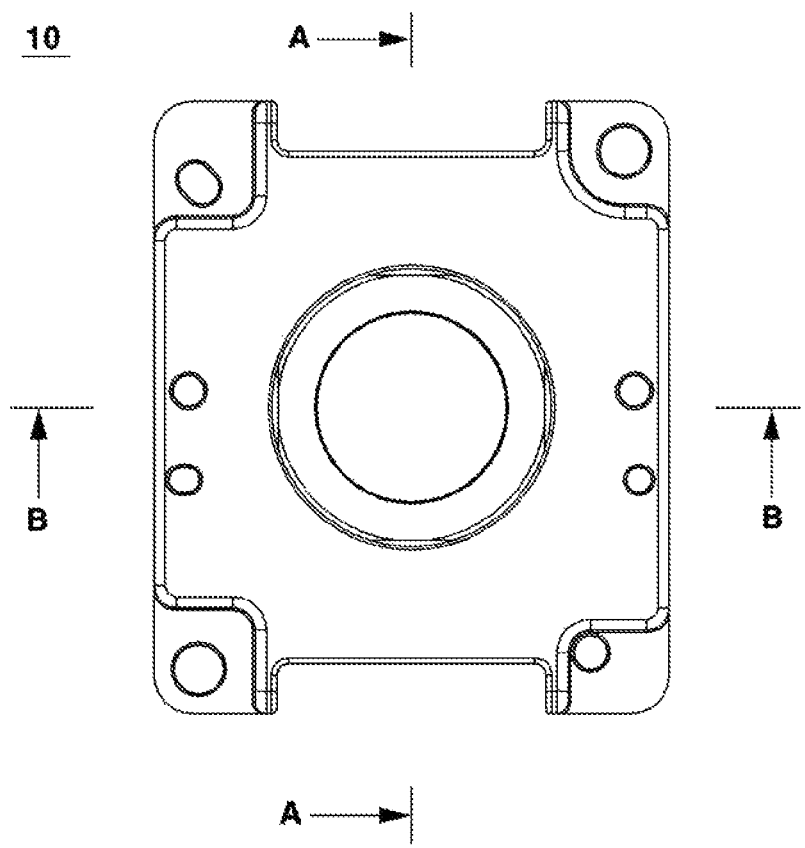
FIG. 6 is a front view of a camera module according to the present embodiment.
Figure 7:
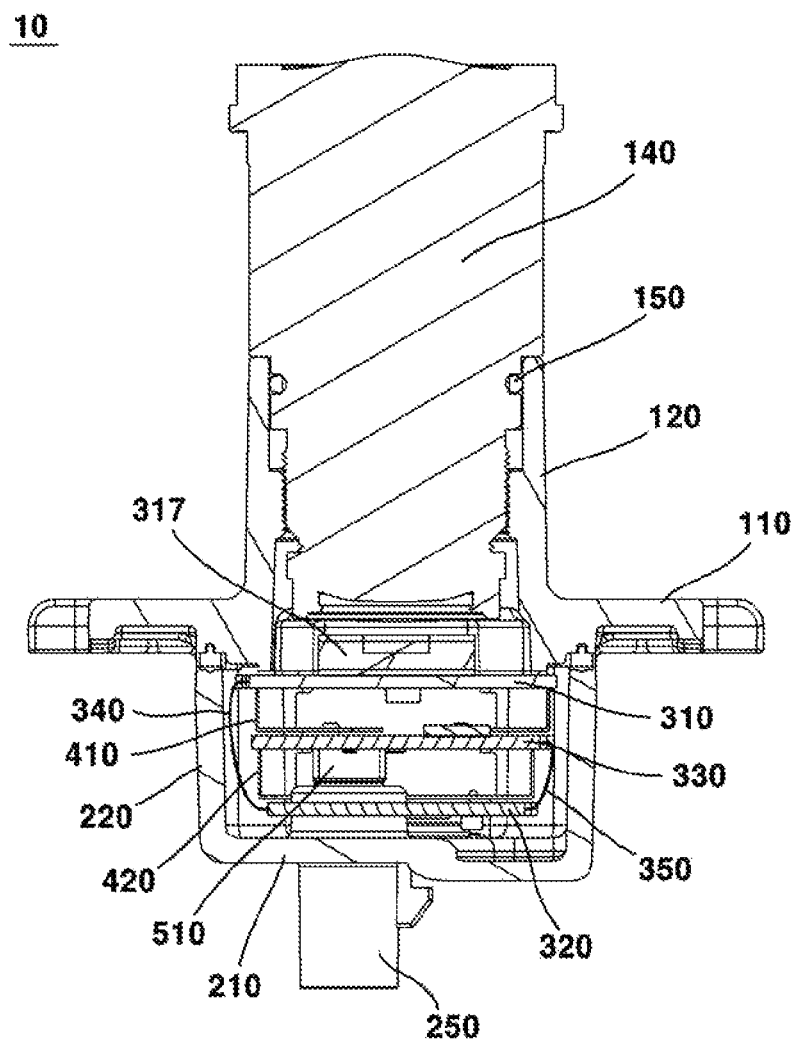
FIG. 7 is a cross-sectional view taken along line A-A of FIG. 6.
Figure 8:
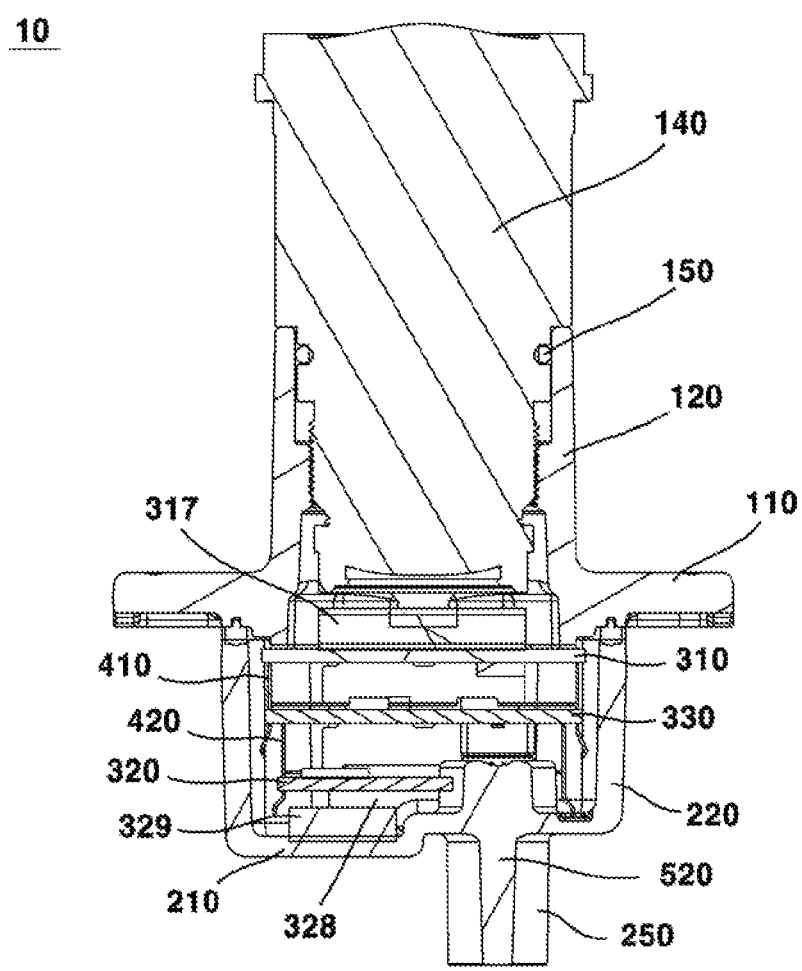
FIG. 8 is a cross-sectional view taken along line B-B of FIG. 6.
Figure 9:
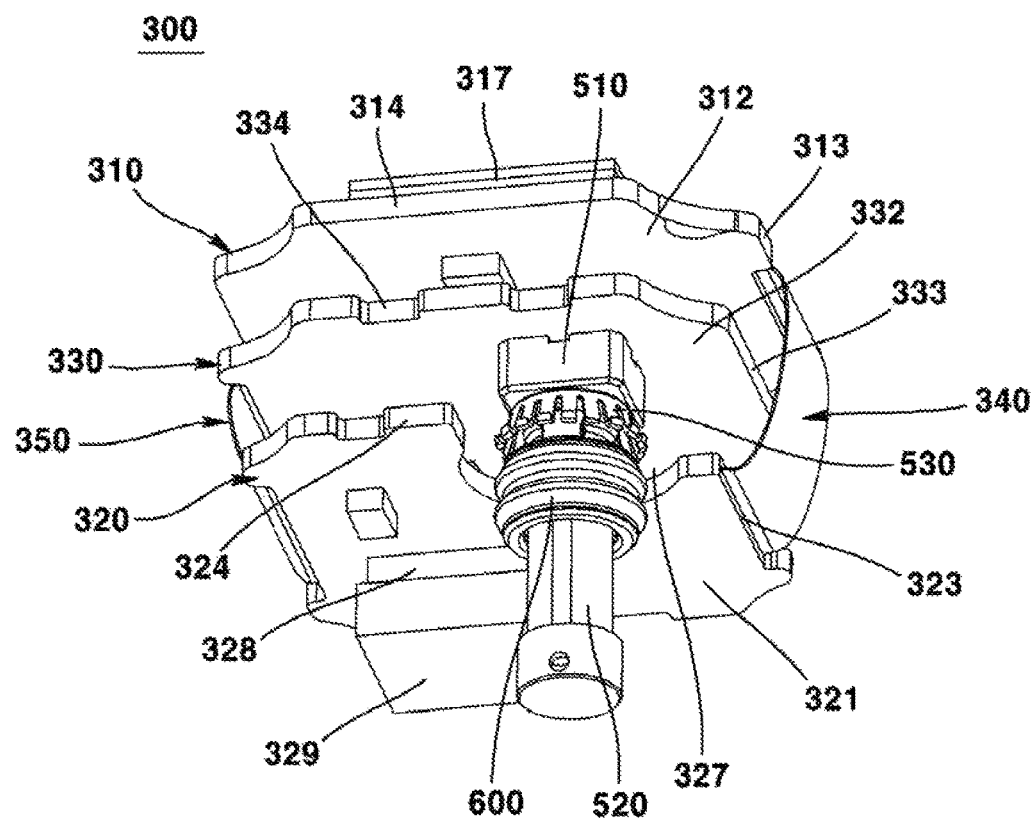
FIG. 9 is a perspective view of a substrate assembly of a camera module according to the present embodiment.
Figure 10:
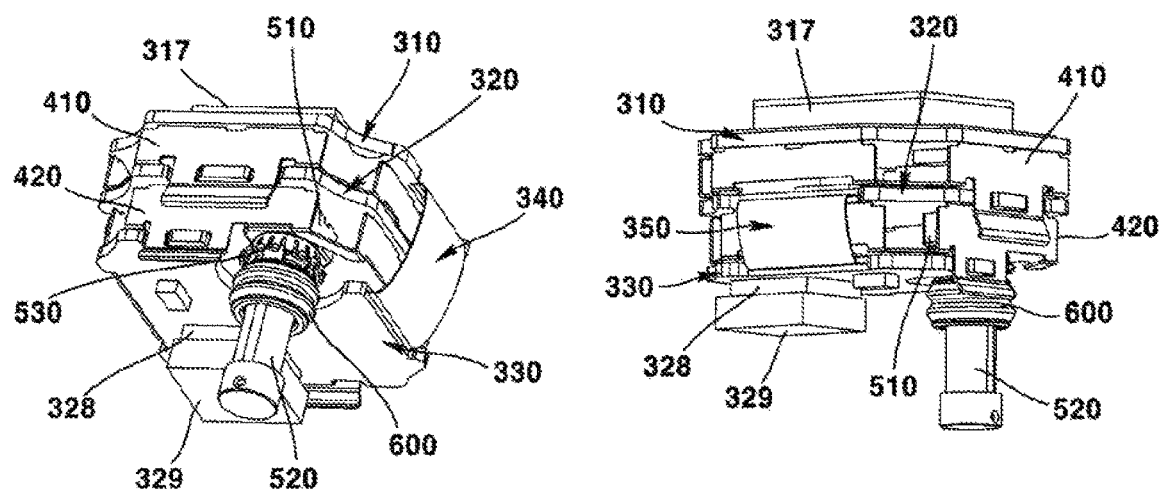
FIG. 10 is a perspective view illustrating a substrate assembly and a support member of a camera module according to the present embodiment.
Figure 11:
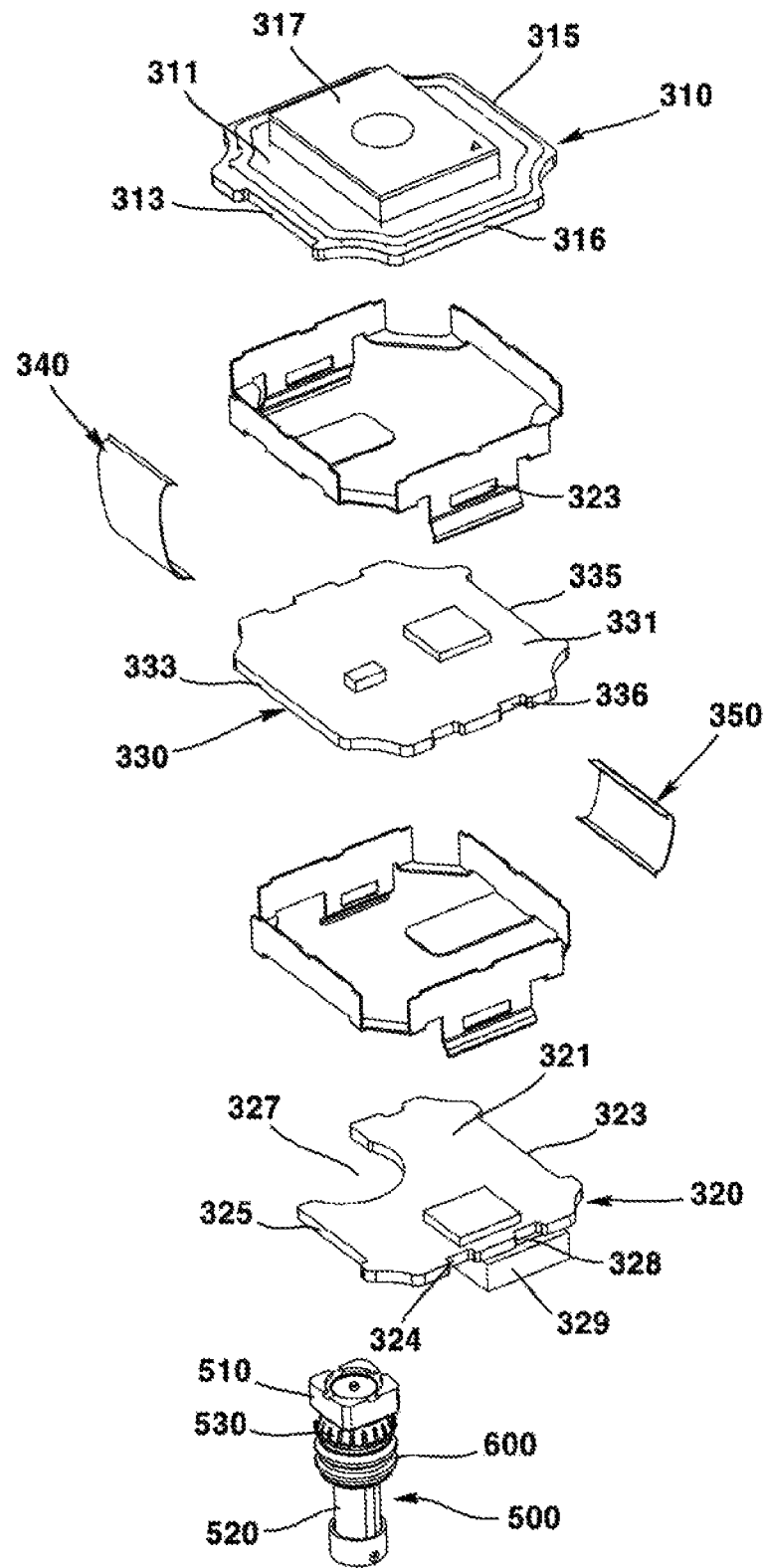
FIG. 11 is an exploded perspective view of FIG. 10.
Figure 12:
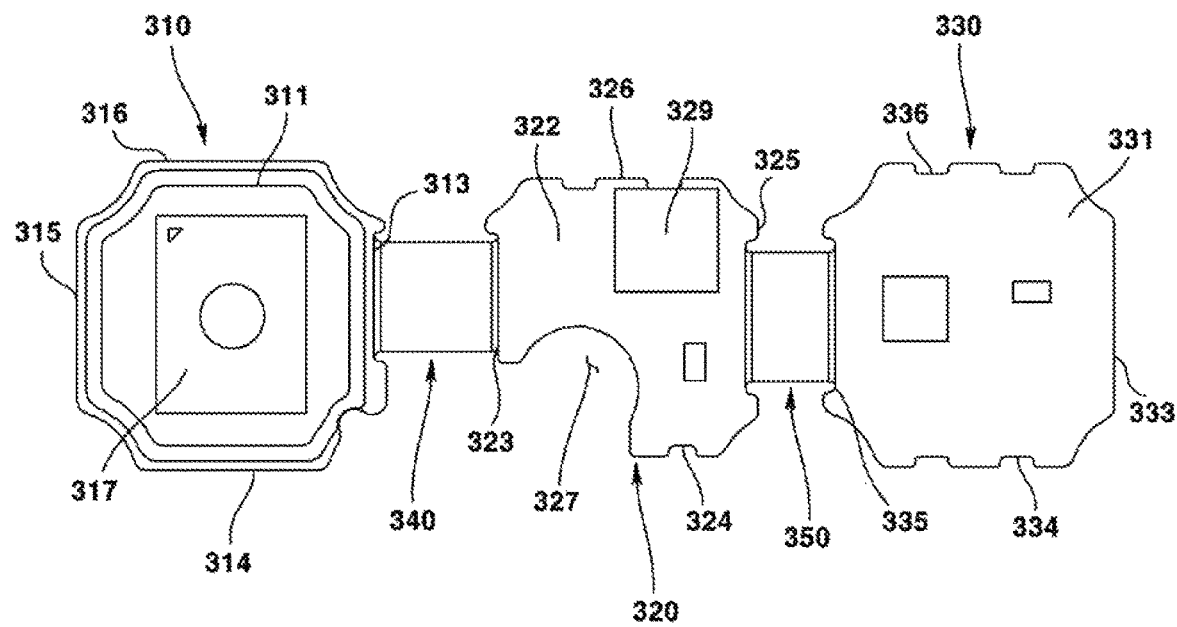
FIGS. 12 and 13 are views illustrating an unfolded state of first to fifth substrates of a camera module according to the present embodiment.
Figure 13:
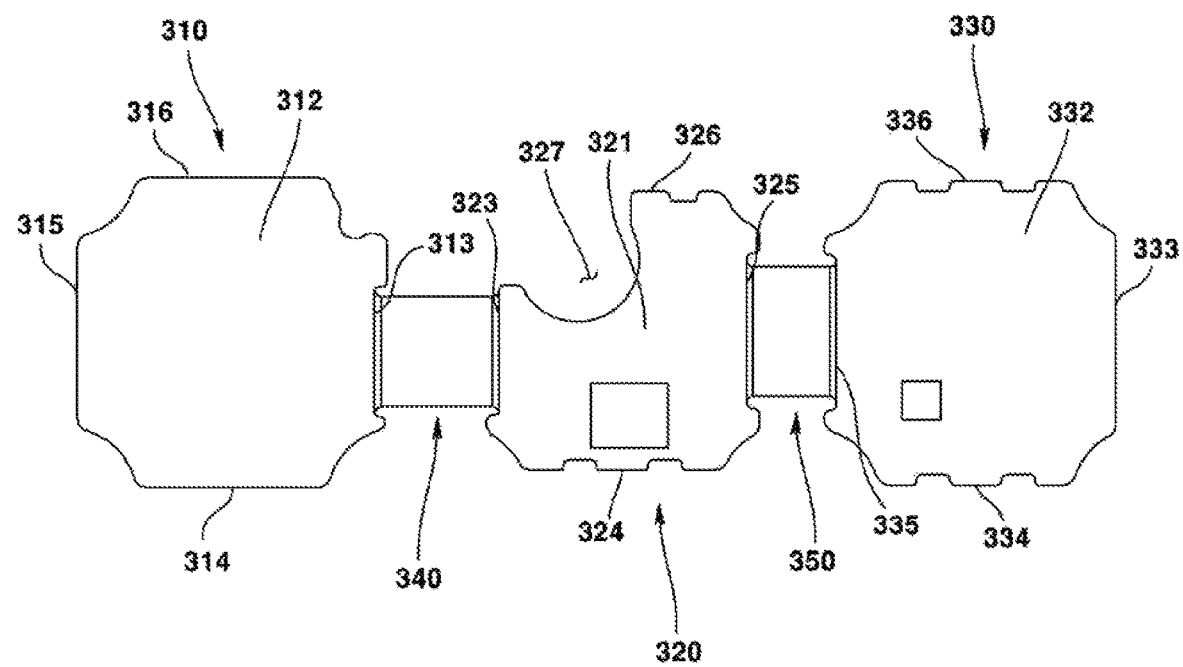
Figure 14:
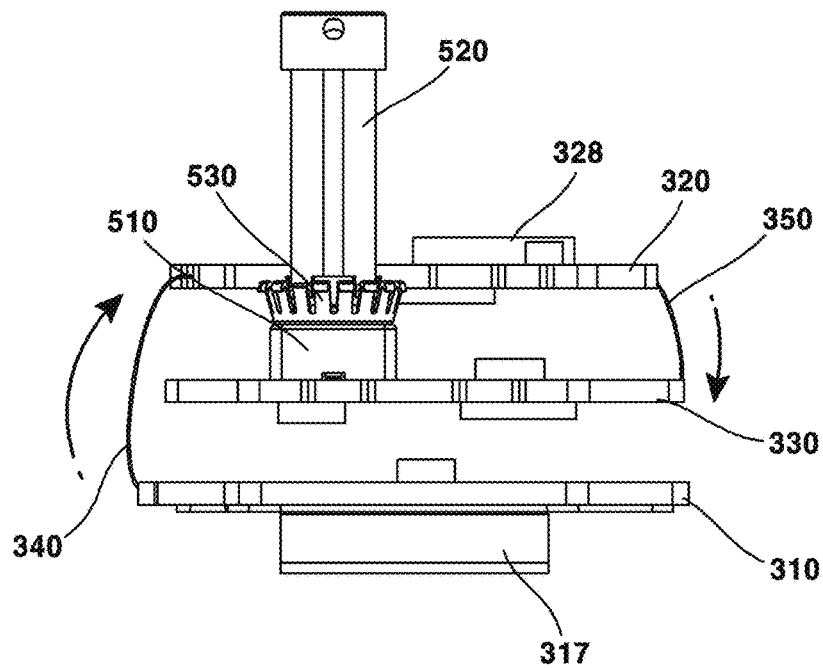
FIG. 14 is a side view of a substrate assembly of a camera module according to the present embodiment.

FIG. 1 is a perspective view of a camera module according to the present embodiment when viewed from an upward direction; FIG. 2 is a perspective view of the camera module according to the present embodiment when viewed from a downward direction; FIG. 3 is an exploded perspective view of FIG. 1; FIG. 4 is an exploded perspective view of FIG. 2; FIG. 5 is a perspective view with a second body of a camera module being removed according to the present embodiment; FIG. 6 is a front view of a camera module according to the present embodiment; FIG. 7 is a cross-sectional view taken along line A-A of FIG. 6; FIG. 8 is a cross-sectional view taken along line B-B of FIG. 6; FIG. 9 is a perspective view of a substrate assembly of a camera module according to the present embodiment; FIG. 10 is a perspective view illustrating a substrate assembly and a support member of a camera module according to the present embodiment; FIG. 11 is an exploded perspective view of FIG. 10; FIGS. 12 and 13 are views illustrating an unfolded state of first to fifth substrates of a camera module according to the present embodiment; and FIG. 14 is a side view of a substrate assembly of a camera module according to the present embodiment.

The camera module 10 according to an embodiment of the present invention may be a vehicle camera module. The camera module 10 may be coupled to a vehicle. The camera module 10 may be used in any one or more among a front camera, a side camera, a rear camera, and a black box of a vehicle. The camera module 10 may be disposed in front of a vehicle. The camera module 10 may be disposed at a rear of a vehicle. The camera module 10 may be coupled to a windshield of a vehicle. The camera module 10 may be coupled to a windshield at a front or rear of a vehicle. The camera module 10 may be disposed at a side of a vehicle. The camera module 10 may photograph a subject and output it as an image on a display (not shown).

The camera module 10 may include bodies 100 and 200. The bodies 100 and 200 may form the outer appearance of the camera module 10. The bodies 100 and 200 may be formed of a metal material. The bodies 100 and 200 may be metal bodies. The bodies 100 and 200 may include a first body 100 and a second body 200.

The first body 100 may be disposed above the second body 200. The first body 100 may be coupled to the second body 200. The first body 100 may be screw-coupled to the second body 200 by a coupling member 700.

The first body 100 may include a body part 110. The body part 110 may have a rectangular plate shape. The cross-sectional area of the body part 110 in a direction perpendicular to the optical axis direction may be larger than the cross-sectional area of the second body 200 in a corresponding direction. The body part 110 may be disposed above the second body 200. The body part 110 may be coupled to the second body 200. The body part 110 may be screw-coupled to the second body 200.

The first body 100 may include a coupling part 120. The coupling part 120 may be protruded upward from an upper surface 110 of the body part 110. A lens module 140, which will be described later, may be disposed in the coupling part 120. The coupling part 120 may be coupled to the lens module 140. The coupling part 120 may include a hole 121. The hole 121 may be formed penetrating through the coupling part 120, the upper surface of the body part 110, and the lower 120 surface of the body part 110. A screw thread 122 may be formed on an inner circumferential surface of the hole 121. At least a portion of the inner circumferential surface of the hole 121 may include a shape of the screw thread 122. The inner circumferential surface of the hole 121 may have a shape corresponding to the outer circumferential surface of the lens module 140. The screw thread 122 of the inner circumferential surface of the hole 121 may have a shape corresponding to the screw thread 141 of the outer circumferential surface of the lens module 140.

The first body 100 may include a pillar 130 being protruded from a lower surface of the body part 110. The pillar 130 may include four pillars 130. The pillar 130 may be formed at positions corresponding to the four corners 230 of the second body 200. The pillar 130 may be disposed in the groove 240 of the second body 200. The pillar 130 may include a groove 131. The groove 131 may be formed by being recessed from the lower end of the pillar 130. A coupling member 700 may be disposed in the groove 131. At least a portion of the coupling member 700 may be disposed in the groove 131. The inner circumferential surface of the groove 131 may have a shape corresponding to the outer circumferential surface of the coupling member 700. The inner circumferential surface of the groove 131 may include a thread shape. The groove 131 may be screw-coupled to the coupling member 700. Through this, the first body 100 and the second body 200 may be coupled.

The first body 100 may include a groove 132 being formed on a lower surface of the body part 110. A second sealing member 160, which will be described later, may be disposed in the groove 132. At least a portion of the second sealing member 160 may be disposed in the groove 132. The protrude part 161 of the second sealing member 160 may be disposed in the groove 132. The groove 132 may be for fixing the second sealing member 160 being disposed in the first body 100 when the first body 100 and the second body 200 are assembled. The groove 132 may be formed in a round shape at a portion corresponding to the pillar 130. The groove 132 may be concavely bent at a portion corresponding to the pillar 130. A portion of the groove 132 facing the pillar 130 may have a round shape. A portion of the groove 132 facing the pillar 130 may be curved in a shape corresponding to the pillar 130. The round shape of the groove 132 may be for avoiding the pillar 130.

The camera module 10 may include a lens module 140. The lens module 140 may be disposed in the first body 100. The lens module 140 may be disposed in the coupling part 120 of the first body 100. The lens module 140 may be coupled to the coupling part 120 of the first body 100. At least a portion of the lens module 140 may be disposed inside the hole 121 of the coupling part 120. A screw thread 141 may be formed on the outer circumferential surface of the lens module 140. The screw thread 141 of the lens module 140 may be formed in a shape corresponding to the screw thread 122 of the coupling part 120. The screw thread 141 of the lens module 140 may be formed to be coupled to the screw thread 122 of the coupling part 120. The lens module 140 may include a groove 142. The groove 142 may be formed on an outer circumferential surface of the lens module 140. The groove 142 may be recessed from an outer circumferential surface of the lens module 140. The groove 142 may be formed at a position higher than the screw thread 141 on an outer circumferential surface of the lens module 140. A first sealing member 150 may be disposed in the groove 142.

The lens module 140 may include a lens. The lens module 140 may include a plurality of lenses. The lens module 140 may include a spacer being disposed between a plurality of lenses. The lens module 140 may be aligned with an image sensor 317, which will be described later. The lens module 140 may be optically aligned with the image sensor 317. The optical axis of the lens module 140 may coincide with the central axis of the image sensor 317. The first body 100 may include an infrared ray filter (IR filter) being disposed between the lens module 140 and the image sensor 317.

The camera module 10 may include a first sealing member 150. The first sealing member 150 may be an O-ring. The first sealing member 150 may be formed of an elastic material. The first sealing member 150 may be disposed in the groove 142 of the lens module 140. At least a portion of the first sealing member 150 may be disposed in the groove 142 of the lens module 140. The first sealing member 150 may be disposed between the lens module 140 and the coupling part 120 of the first body 100. The first sealing member 150 may fill a space that may occur between the lens module 140 and the coupling part 120 of the first body 100. Through this, the lens module 140 may be firmly fixed to the coupling part 120, and moisture may be prevented from penetrating between the lens module 140 and the coupling part 120. The first sealing member 150 is disposed between the lens module 140 and the coupling part 120 so that it may perform the role of waterproofing function.

The camera module 10 may include a second sealing member 160. The second sealing member 160 may be referred to as any one of a gasket and a waterproof member. The second sealing member 160 may be formed of a material having elasticity. The second sealing member 160 may be disposed between the first body 100 and the second body 200. The second sealing member 160 may be disposed in the groove 132 of the body part 110. At least a portion of the second sealing member 160 may be disposed in the groove 132 of the body part 110. The second sealing member 160 may be formed in a shape corresponding to the groove 132 of the body part 110. The second sealing member 160 may be formed in a shape corresponding to the side surface of the first substrate 310. The first sealing member 160 may be disposed at an outer side of the first substrate 310. The second sealing member 160 may be disposed in a space that may occur between the first body 100 and the second body 200. The second sealing member 160 may be disposed in a separation space of the first body 100 and the second body 200. The height of the second sealing member 160 in an optical axis direction may be smaller after assembly than before assembly. That is, the second sealing member 160 may be disposed between the first body 100 and the second body 200 in a compressed state in an optical axis direction so that it may perform the role of waterproofing function. Through this, it is possible to prevent moisture from penetrating through the space between the first body 100 and the second body 200.

The second sealing member 160 may include a protrusion 161. The protrusion 161 may be protruded upward from an upper surface corresponding to the first body 100 of the second sealing member 160. The protrusion 161 may be protruded from at least a portion of an upper surface of the second sealing member 160. The protrusion 161 may be disposed in the groove 121 of the first body 100. The protrusion 161 may be disposed in the groove 132 of the body part 110 and fixed to the first body 100. Through this, when the first body 100 and the second body 200 are assembled, the second sealing member 160 may not be separated from the designated position. That is, the second body 200 is assembled in a state where the second sealing member 160 is disposed in the first body 100, and the protrusion 161 of the second sealing member 160 is inserted into the groove 132 of the body part 110 so that the second body 200 can be assembled without being separated from the designated position. Furthermore, the groove 132 may perform the role of guiding the position of the second sealing member 160.

The camera module 10 may include a second body 200. The second body 200 may be referred to as any one among a rear body, a lower housing, and a second housing. The second body 200 may be formed of a metal material. The second body 200 may be a metal body. The second body 200 may be formed in a rectangular shape with an open upper portion. The second body 200 may be disposed below the first body 100. The second body 200 may be coupled to the first body 100. The second body 200 may be screw-coupled to the first body 100. The second body 200 may be disposed below the body part 110 of the first body 100. The second body 200 may be coupled to the body part 110 of the first body 100. The second body 200 may form an internal space through coupling with the first body 100. A second sealing member 160 may be disposed at an upper portion of the second body 200.

The second body 200 may include a bottom plate 210 and a side plate 220 being extended from the bottom plate 210. The side plate 220 may be extended upward from an edge of the bottom plate 210. The second body 200 may include a plurality of side plates 220 and a corner 230 being formed between the plurality of side plates 220. The second body 200 may include four side plates 220 and four corners 230 being disposed between the four side plates 220.

The bottom plate 210 may include a hole. A connector withdrawal part 250, which will be described later, may be disposed in the hole. The connector withdrawal part 250 may penetrate through the hole. The diameter of the hole in a direction perpendicular to the optical axis direction may be the same as the diameter of the outer circumferential surface of the connector withdrawal part 250 in a corresponding direction. The diameter of the hole in a direction perpendicular to the optical axis direction may be larger than the diameter in a corresponding direction of the inner circumferential surface of the connector withdrawal 250.

The second body 200 may include a groove 240 being formed on an upper surface being coupled to the first body 100. The grooves 240 may be formed at positions corresponding to the four corners 230 of the second body 200. The groove 240 may be overlapped with the pillar 130 of the first body 100 in an optical axis direction. The pillar 130 of the first body 100 may be disposed in the groove 240. The groove 240 may include a bottom surface 241 being disposed at a position lower than the upper surface of the second body 200. The bottom surface 241 may be in contact with the lower end of the pillar 130. A hole 242 may be formed in the bottom surface 241. The hole 242 may be overlapped with the groove 131 of the pillar 130 of the first body 100 an the optical axis direction. A coupling member may penetrate through the hole 242. The inner circumferential surface of the hole 242 may be formed in a shape corresponding to the outer circumferential surface of the coupling member 700. The inner circumferential surface of the hole 242 may include a screw thread shape. The coupling member 700 penetrating through the hole 242 may be disposed in the groove 131 of the pillar 130 of the first body 100.

The second body 200 may include a connector withdrawal part 250. The connector withdrawal part 250 may be formed in a cylindrical shape. The connector withdrawal part 250 may be coupled to the second body 200. The connector withdrawal part 250 may penetrate through the hole of the bottom plate 210 of the second body 200. The connector withdrawal part 250 may be disposed inside the hole of the bottom plate 210 of the second body 200. At least a portion of the connector withdrawal part 250 may be disposed in the second body 200, and the remainder of the connector withdrawal part 250 may be exposed toward the outside of the second body 200.

The connector withdrawal part 250 may be coupled to the bottom plate 210 of the second body 200. Connectors 510 and 520 may be disposed inside the connector withdrawal part 250. A second connector 520 may be disposed inside the connector withdrawal part 250. The connector withdrawal part 250 may include a hole. Connectors 510 and 520 may be disposed in the hole. The hole of the connector withdrawal part 250 may accommodate at least a portion of the connectors 510 and 520. Through this, the connector withdrawal part 250 can fix the connectors 510 and 520.

The camera module 10 may include a substrate assembly 300. The substrate assembly 300 may be disposed inside the second body 200. The substrate assembly 300 may be disposed in an internal space formed by coupling the first body 100 and the second body 200.

The substrate assembly 300 may include a first substrate 310. The first substrate 310 may include a printed circuit board. The first substrate 310 may include a rigid printed circuit board. An image sensor 311 may be disposed in the first substrate 310. At this time, the first substrate 310 may be referred to as a sensor substrate.

The first substrate 310 may include a first surface 311 facing the first body 100 and a second surface 312 being disposed at an opposite side of the first surface 311. The image sensor 317 may be disposed on the first surface of the first substrate 310. The first substrate 310 may be coupled to the first body 100. The first surface 311 of the first substrate 310 may be coupled to the first body 100. The first substrate 310 has a first side surface 313 and a second side surface 314, a third side surface 315 being disposed at an the opposite side of the first side surface 313, and a fourth side 316 being disposed at an the opposite side of the second side surface 314.

The first substrate 310 may be disposed above the third substrate 330. The first substrate 310 may be spaced apart from the third substrate 330 in an optical axis direction. The first substrate 310 may be spaced apart from the third substrate 330 by the first support member 410. The second surface 312 of the first substrate 310 may face the third substrate 330. The second surface 312 of the first substrate 310 may face the first surface 331 of the third substrate 330. The first substrate 310 may be spaced apart from the second substrate 320 in an optical axis direction. The separation distance between the first substrate 310 and the third substrate 330 in an optical axis direction may be smaller than the separation distance between the first substrate 310 and the second substrate 320 in an optical axis direction.

The first substrate 310 may be connected to the second substrate 320. At least a portion of the first substrate 310 may be connected to the second substrate 320. The first substrate 310 may be electrically connected to the second substrate 320. The first substrate 310 may be electrically connected to the second substrate 320 by a fourth substrate 340, which will be described later. The first substrate 310 may be connected by the second substrate 320 and the fourth substrate 340.

The first substrate 310 may be connected to the fourth substrate 340. At least a portion of the first substrate 310 may be connected to the fourth substrate 340. The first substrate 310 may be electrically connected to the fourth substrate 340. One end of the fourth substrate 340 may be disposed on the first side surface 313 of the first substrate 310. The first side surface 313 of the first substrate 310 may be coupled to one end of the fourth substrate 340.

The substrate assembly 300 may include a second substrate 320. The second substrate 320 may include a printed circuit board. The second substrate 320 may include a rigid printed circuit board. The second substrate 32 may be referred to as an image sensor processor (ISP) substrate. The second substrate 320 may be disposed below a third substrate 330, which will be described later. The second substrate 320 may be disposed at a position closer to the bottom plate 210 of the second body 200 than the first substrate 310 and the third substrate 330. The second substrate 320 may be spaced apart from the first substrate 310. The second substrate 320 may be spaced apart from the third substrate 330 in an optical axis direction. The separation distance between the second substrate 320 and the first substrate 310 in an optical axis direction may be greater than the separation distance between the second substrate 320 and the third substrate 330 in an optical axis direction. The second substrate 320 may be disposed parallel to the first substrate 310. The second substrate 320 may be disposed parallel to a third substrate 330, which will be described later. The second substrate 320 may be spaced apart from the bottom plate 210 of the second body 200 in an optical axis direction. The second substrate 320 may include a first surface 321 facing the third substrate 330 and a second surface 322 being disposed at an opposite side of the first surface 321. The first surface 321 of the second substrate 320 may face the second surface 332 of the third substrate 330. The second surface 322 of the second substrate 320 may face the bottom plate 210 of the second body 200. A processor 328 may be disposed on the second surface 322 of the second substrate 320.

The second substrate 320 has a first side surface 323 and a second side surface 324, a third side surface 325 being disposed at an opposite side of the first side surface 323, and a fourth side surface 326 being disposed at an opposite side of the third side surface 324.

The second substrate 320 may include a groove 327. The groove 327 may be formed to be recessed inwardly from a side surface of the second substrate 320. The groove 327 may be recessed from at least a portion of the first side surface 321 of the second substrate 320. The groove 327 may be recessed from at least a portion of the fourth side surface 326 of the second substrate 320. The groove 327 may have a round shape at least in part. A connector 500 may be disposed in the groove 327. The connector 500 may penetrate through the groove 327. The groove 327 may be overlapped with the connector 500 in a direction perpendicular to the optical axis direction. The groove 327 may not be overlapped with the first connector 510 of the connector 500 in a direction perpendicular to the optical axis direction. The groove 327 may be overlapped with the second connector 520 of the connector 500 in a direction perpendicular to the optical axis direction. The groove 327 may be spaced apart from the connector 500. The groove 327 may be formed to avoid the connector 500. Through this, the connector 500 may be disposed in the third substrate 330 being disposed between the first substrate 310 and the second substrate 320.

The second substrate 320 may include a processor 328. The processor 328 may be an image sensor processor (ISP) device. The processor 328 may be a device that converts RGB signals (red, green, and blue signals) of the image sensor 317 into signals visible to the naked eye. The processor 328 may be a device that converts a raw Bayer pattern signal of the image sensor 317 into a signal visible to the naked eye.

The processor 328 may be disposed in the second substrate 320. The processor 328 may be disposed on the second surface 322 of the second substrate 320. The processor 328 may be disposed between the second surface 322 of the second substrate 320 and the bottom plate 210 of the second body 200. The processor 328 may face the bottom plate 210 of the second body 200. The processor 328 may be spaced apart from the bottom plate 210 of the second body 200 in an optical axis direction. A heat dissipation pad 329, which will be described later, may be disposed on the processor 328. The processor 328 may dissipate more heat so that the camera module 10 can output a high-resolution image.

The second substrate 320 may be connected to the first substrate 310. The second substrate 320 may be electrically connected to the first substrate 310. The second substrate 320 may be electrically connected to the first substrate 310 by the fourth substrate 340. The second substrate 320 may be connected to the third substrate 330. The second substrate 320 may be electrically connected to the third substrate 330. The second substrate 320 may be electrically connected to the third substrate 330 by a fifth substrate 350, which will be described later.

The substrate assembly 300 may include a third substrate 330. The third substrate 330 may include a printed circuit board. The third substrate 330 may include a rigid printed circuit board. The third substrate 330 may be a serializer PCB. The third substrate 330 may change the current supplied through the connector 500 into a stable current. The third substrate 330 may convert the current supplied through the connector 500 into a stable current value and supply it to the second substrate 320. The third substrate 330 may convert the current supplied through the connector 500 into a stable current value and supply it to the processor 328. The third substrate 330 may convert the current supplied through the connector 500 into a stable current value and supply it to the first substrate 310. The third substrate 330 may convert the current supplied through the connector 500 into a stable current value and supply it to the image sensor 317. The current value supplied through the connector 500 in the vehicle is different from the current value required by the components such as the second substrate 320 and the processor 328, but the third substrate 330 is supplied through the connector 500. It may play the role of converting a current to a current value required by components such as the second substrate 320 and the processor 328 and supply the current to the corresponding components.

The third substrate 300 may include a first surface 331 and a second surface 332 being disposed at an opposite side of the second surface 331. The third substrate 300 may include a first side surface 333 and a second side surface 334, a third side surface 335 being disposed at an opposite side of the first side surface 333, and a fourth side surface 336 being disposed a second side surface 334.

The third substrate 330 may be disposed below the first substrate 310. The third substrate 330 may be disposed above the second substrate. The third substrate 330 may be disposed between the first substrate 310 and the third substrate 330. The third substrate 330 may be disposed parallel to the first substrate 310. The third substrate 330 may be disposed parallel to the second substrate 320. The first surface 331 of the third substrate 330 may face the first substrate 310. The first surface 331 of the third substrate 330 may face the second surface 312 of the first substrate 310. The second surface 332 of the third substrate 330 may face the second substrate 320. The second surface 332 of the third substrate 330 may face the second surface 321 of the second substrate 320.

The third substrate 330 may be electrically connected to the connector 500. A connector 500 may be disposed in the second substrate 330. A connector 500 may be disposed on the second surface 332 of the third substrate 330. A first connector 510 may be disposed on the second surface 332 of the third substrate 330. The third substrate 330 may be electrically connected to the first connector 510. Through this, the third substrate 330 may receive current from the connector 500. Through this, the third substrate 330 may supply current to the second substrate 320.

The third substrate 330 may be connected to a fifth substrate 350, which will be described later. The third substrate 330 may be electrically connected to the fifth substrate 350. One end of the fifth substrate 350 may be disposed on the third side surface 335 of the third substrate 330. The third side surface 335 of the third substrate 330 may be coupled to one end of the fourth substrate 340.

The substrate assembly 300 may include a fourth substrate 340. The fourth substrate 340 may include a flexible printed circuit board (FPCB). The fourth substrate 340 may be formed of an elastic material. The fourth substrate 340 may be electrically connected to the first substrate 310. The fourth substrate 340 may be electrically connected to the second substrate 320. The fourth substrate 340 may electrically connect the first substrate 310 and the second substrate 320 to each other. One end of the fourth substrate 340 may be coupled to the first substrate 310. One end of the fourth substrate 340 may be coupled to the first side surface 313 of the first substrate 310. The other end of the fourth substrate 340 may be coupled to the second substrate 320. The other end of the fourth substrate 340 may be coupled to the first side surface 323 of the second substrate 320.

The length of the fourth substrate 340 in an optical axis direction may be longer than the length of the fifth substrate 350, which will be described later, in the corresponding direction. At least a portion of the fourth substrate 340 may be overlapped with the third substrate 330 in a direction perpendicular to the optical axis direction. The width of the fourth substrate 340 in a direction perpendicular to the optical axis direction may be smaller than the width of the fifth substrate 350 in a corresponding direction. At least a portion of the fourth substrate 340 may be overlapped with the fifth substrate 350 in a direction perpendicular to the optical axis direction.

The substrate assembly 300 may include a fifth substrate 350. The fifth substrate 350 may include a flexible printed circuit board (FPCB). The fifth substrate 350 may be formed of an elastic material. The fifth substrate 350 may be electrically connected to the second substrate 320. The fifth substrate 350 may be electrically connected to the third substrate 330. The fifth substrate 350 may electrically connect the second substrate 320 and the third substrate 330. One end of the fifth substrate 350 may be coupled to the third substrate 330. One end of the fifth substrate 350 may be coupled to the third side surface 335 of the third substrate 330. The other end of the fifth substrate 345 may be coupled to the second substrate 320. The other end of the fifth substrate 350 may be coupled to the third side surface 325 of the second substrate 320.

The length of the fifth substrate 350 in an optical axis direction may be longer than the length of the fourth substrate 340 in the corresponding direction. The fifth substrate 350 may not be overlapped with the first substrate 310 in a direction perpendicular to the optical axis direction. The width of the fifth substrate 350 in a direction perpendicular to the optical axis direction may be smaller than the width of the fourth substrate 340 in a corresponding direction.

The camera module 10 may include a heat dissipation pad 329. A heat dissipation pad 329 may be disposed on the processor 328. The heat dissipation pad 329 may face the bottom plate 210 of the second body 200. The heat dissipation pad 329 may be in contact with the bottom plate 210 of the second body 200. The heat dissipation pad 329 may be formed of a thermally conductive material. The heat dissipation pad 329 may transfer heat emitted from the processor 328 to the second body 200. The heat dissipation pad 329 may transfer heat emitted from the processor 328 to the bottom plate 210 of the second body 200. Through this, heat generated by the processor 328 may be transferred to the second body 200 made of metal through the heat dissipation pad 329, and the heat transferred to the second body 200 may be emitted to the outside. As the heat dissipation pad 329, a heat dissipation pad 329 having high thermal conductivity may be used according to the internal temperature of the bodies 100 or 200. That is, the camera module 10 according to the present embodiment may be capable of dissipating heat even if the amount of heat generated by the processor 328 is large by changing or replacing the heat dissipation pad 329. The thickness of the heat dissipation pad 329 in an optical axis direction may be thicker than the thickness of the processor 329 in an optical axis direction.

The camera module 10 may include a support member 400. The support member 400 may be referred to as any one among a shield can, a shield member, and a spacer. The support member 400 may be formed of a metal material. The support member 400 may be disposed inside the bodies 100 and 200. The support member 400 may be disposed inside the second body 200. The support member 400 may include a plurality of support members 410 and 420. In the present embodiment, the plurality of support members 410 and 420 will be described as an example of two, but the present invention is not limited thereto and may be variously changed according to the number of substrates. The support member 400 may be disposed between the plurality of substrates to space the plurality of substrates apart in an optical axis direction. The support member 400 may be disposed between the plurality of substrates to support the plurality of substrates. The support member 400 may perform an electromagnetic wave shielding function.

The support member 400 may include a first support member 410. The first support member 410 may be disposed below the first substrate 310. The first support member 410 may be disposed above the third substrate 330. The first support member 410 may be disposed between the first substrate 310 and the third substrate 330. An upper end of the first support member 410 may be in contact with the first substrate 310. The upper end of the first support member 410 may be in contact with the second surface 312 of the first substrate 310. The lower end of the first support member 410 may be in contact with the third substrate 330. The lower end of the first support member 410 may be in contact with the first surface 331 of the third substrate 330. At least a portion of the first support member 410 may be overlapped with a second support member 420, which will be described later, in a direction perpendicular to the optical axis direction.

The support member 400 may include a second support member 420. The second support member 420 may be disposed in the second substrate 320. The second support member 420 may be disposed below the third substrate 330. The second support member 420 may be disposed between the third substrate 330 and the second substrate 320. An upper end of the second support member 420 may be in contact with the third substrate 330. The upper end of the second support member 420 may be in contact with the second surface 332 of the third substrate 330. A lower end of the second support member 420 may be in contact with the second substrate 320. The lower end of the second support member 420 may be in contact with the second surface 332 of the second substrate 320. At least a portion of the second support member 420 may be overlapped with a first support member 410, which will be described later, in a direction perpendicular to the optical axis direction.

The camera module 10 may include a connector 500. The connector 500 may be disposed inside the bodies 100 and 200. The connector 500 may be disposed inside the second body 200. The connector 500 may electrically connect a cable (not shown) and the third substrate 330. The connector 500 may include a first connector 510 electrically connected to the third substrate 330 and a second connector 520 electrically connecting the first connector 510 and a cable. The first connector 510 may be disposed in the third substrate 330. The first connector 510 may be disposed on the second surface 332 of the third substrate 330. The first connector 510 may be electrically connected to the third substrate 330. At least a portion of the connector 500 may be disposed at a higher position than the second substrate 320. The remaining part of the connector 500 may be disposed at a lower position than the second substrate 320.

The first connector 510 may be disposed between the second substrate 320 and the third substrate 330. The first connector 510 may be spaced apart from the second substrate 320 in an optical axis direction. The first connector 510 may be disposed closer to the third substrate 330 than the second substrate 320. At least a portion of the first connector 510 may be overlapped with the fourth substrate 340 in a direction perpendicular to the optical axis direction. The first connector 510 may be overlapped with the fifth substrate 350 in a direction perpendicular to the optical axis direction. A ground member 530, which will be described later, may be disposed in the first connector 510. The first connector 510 may be integrally formed with the ground member 530.

The second connector 520 may be electrically connected to the first connector 510. The second connector 520 may be electrically connected to the cable. The second connector 520 may be disposed inside the connector withdrawal part 250 of the second body 200. At least a portion of the second connector 520 may be disposed inside the connector withdrawal part 250 of the second body 200, and the remainder of the second connector 520 may be disposed inside the second body 200. The second connector 520 may penetrate through the groove 327 of the second substrate 320. A portion of the second connector 520 may be disposed between the second substrate 320 and the third substrate 330, and the remaining portion of the second connector 520 may be disposed at a lower position than the second substrate 320. The second connector 520 may be integrally formed with the ground member 530.

The second connector 520 may be electrically connected to the first connector 510. The second connector 520 may be electrically connected to the cable. The second connector 520 may be disposed inside the connector withdrawal part 250 of the second body 200. At least a portion of the second connector 520 may be disposed inside the connector withdrawal part 250 of the second body 200, and the remainder of the second connector 520 may be disposed inside the second body 200. The second connector 520 may penetrate through the groove 327 of the second substrate 320. A portion of the second connector 520 may be disposed between the second substrate 320 and the third substrate 330, and the remaining portion of the second connector 520 may be disposed at a lower position than the second substrate 320. The second connector 520 may be integrally formed with the ground member 530.

The camera module 10 may include a third sealing member 600. The third sealing member 600 may be a waterproof member. The third sealing member 600 may be formed of a material having elasticity. The third sealing member 600 may be spaced apart from the ground member 530 in an optical axis direction. The third sealing member 600 may be disposed at a lower position than the second substrate 320. The third sealing member 600 may be disposed in the second connector 520. The third sealing member 600 may be disposed inside the second body 200. The third sealing member 600 may be disposed inside the connector withdrawal part 250 of the second body 200. Through this, it is possible to prevent moisture from penetrating between the second body 200 and the connector 500.

The camera module 10 may include a coupling member 700. The coupling member 700 may couple the first body 100 and the second body 200. The coupling member 700 may screw-couple the first body 100 and the second body 200 to each other. The coupling member 700 may include a bolt. The coupling member 700 may include a screw. A thread may be formed on the outer circumferential surface of the coupling member 700. The coupling member 700 may be coupled to the hole 242 of the second body 200. The coupling member 700 may penetrate the hole 242 of the second body 200. The coupling member 700 penetrating through the hole 242 of the second body 200 may be disposed in the groove 131 of the pillar 130 of the first body 100. Through this, the coupling member 700 may couple the first body 100 and the second body 200.

Hereinafter, a heat dissipation path of the camera module 10 according to the present embodiment will be described in detail with reference to the drawings.

Figure 15:
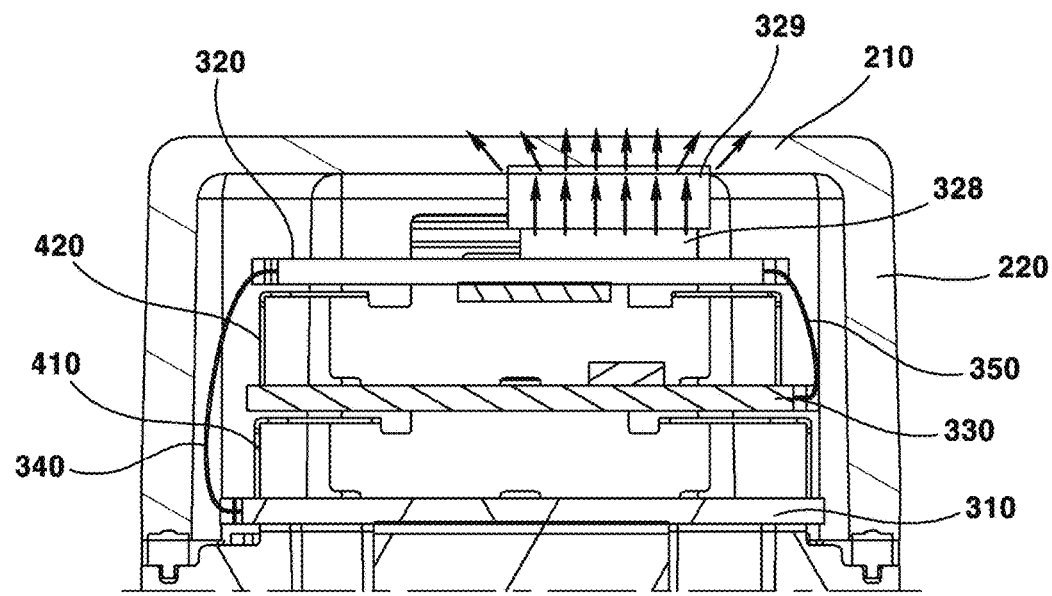
FIG. 15 is a diagram illustrating a heat dissipation path of a camera module according to the present embodiment.

FIG. 15 is a diagram illustrating a heat dissipation path of a camera module according to the present embodiment.

Recently, as a camera module outputs a high-resolution image, the number of substrates increases, and the size and number of devices mounted on the substrate increase. At this time, since the amount of heat generated from the substrate or an element mounted on the substrate is increased, the temperature inside the camera module is rising, so there is an issue about a heat dissipation structure that radiates heat to the outside.

Referring to FIG. 15, heat generated from the processor 328 is transferred to the heat dissipation pad 329, and the heat transferred to the heat dissipation pad 329 may be transferred to the second body 200 made of a metal material to be discharged toward the outside. Through this, heat inside the bodies 100 and 200 may be radiated to the outside to lower the temperature. As a modified embodiment, the camera module 10 may not include the heat dissipation pad 329. In this case, the heat generated from the processor 328 may be transferred to the second body 200 to be discharged toward the outside.

The camera module 10 according to the present embodiment changes the assembly structure of the substrates 310, 320, and 330 so that it is possible to design in a way that the processor 328, which generates a lot of heat, can be to arranged in a position adjacent to the bottom plate 210 of the second body 200. In addition, by changing the assembly structure of the substrates 310, 320, and 330, it is possible to design a structure advantageous for heat dissipation by making contact with a component such as a heat dissipation pad 329 having high thermal conductivity. In addition, the heat dissipation performance may be improved by changing the area, thickness, and material of the heat dissipation pad 329.

The embodiments of the present invention have been described above with reference to the accompanying drawings, but a person skilled in the art to which the present invention belongs may understand that the present invention can be implemented in other specific forms without changing the technical spirit or essential features. Therefore, it should be understood that the embodiments described above are illustrative and non-limiting in all respects.

The invention claimed is:

1. A camera module comprising:
    a first body comprising a lens;
    a second body coupled to the first body;
    a substrate assembly disposed inside the second body; and
    a connector disposed on the substrate assembly,
    wherein the substrate assembly comprises:
        a first substrate and a second substrate;
        a third substrate disposed between the first substrate and the second substrate in an optical axis direction;
        a fourth substrate electrically connecting the first substrate and the second substrate;
        a fifth substrate electrically connecting the second substrate and the third substrate; and
        a processor disposed on the second substrate,
        wherein a length of the fourth substrate is longer than a length of the fifth substrate,
    wherein the first substrate, the fourth substrate, the second substrate, the fifth substrate, and the third substrate are electrically connected in order,
    wherein the connector is disposed on the third substrate, and
    wherein the second substrate comprises a groove through which the connector penetrates.

2. The camera module according to claim 1, wherein the processor is disposed closer to a bottom plate of the second body than the first to fifth substrates.

3. The camera module according to claim 1, wherein at least a portion of the fourth substrate is overlapped with the second substrate in a direction perpendicular to the optical axis direction.

4. The camera module according to claim 1, wherein the fourth substrate is overlapped with the fifth substrate in a direction perpendicular to the optical axis direction.

5. The camera module according to claim 1, wherein at least a portion of the connector is overlapped with the second substrate in a direction perpendicular to the optical axis direction.

6. The camera module according to claim 1, wherein at least a portion of the connector is disposed at a position higher than the second substrate, and
    wherein the remaining portion of the connector is disposed at a position lower than the second substrate.

7. The camera module according to claim 1, wherein a distance between the first substrate and the second substrate in the optical axis direction is longer than a distance between the first substrate and the third substrate in the optical axis direction.

8. The camera module according to claim 1, wherein the second body comprises a bottom plate, a side plate extended upwardly from the bottom plate,
   wherein the camera module comprises a heat dissipation pad disposed between the processor and the bottom plate of the second body,
   wherein one surface of the heat dissipation pad is in contact with the processor, and
   wherein the other surface of the heat dissipation pad is in contact with the bottom plate of the second body.

9. The camera module according to claim 8, wherein the heat dissipation pad is formed of a thermally conductive material.

10. The camera module according to claim 8, wherein a thickness of the heat dissipation pad in the optical axis direction is greater than a thickness of the processor in the optical axis direction.

11. The camera module according to claim 8, wherein heat generated in the processor is transferred to the heat dissipation pad, and
   wherein the heat transferred to the heat dissipation pad is radiated to the outside through the bottom plate of the second body.

12. The camera module according to claim 1, wherein a width of the fourth substrate in a direction perpendicular to the optical axis direction is smaller than a width of the fifth substrate in a direction perpendicular to the optical axis direction.

13. The camera module according to claim 1, wherein the first to third substrates comprise a rigid printed circuit board, and
   wherein the fourth to fifth substrates comprise a rigid printed circuit board.

14. A camera module comprising:
   a first body comprising a lens;
   a second body coupled to the first body;
   a substrate assembly disposed inside the second body; and
   a connector disposed on the substrate assembly,
   wherein the substrate assembly comprises:
      a first substrate and a second substrate;
      a third substrate disposed between the first and second substrates in an optical axis direction;
      a fourth substrate electrically connecting the first substrate and the second substrate;
      a fifth substrate electrically connecting the second substrate and the third substrate; and
      a processor disposed on the second substrate,
   wherein a length of the fourth substrate in the optical axis direction is longer than a length of the fifth substrate in the optical axis direction,
   wherein the first substrate, the fourth substrate, the second substrate, the fifth substrate, and the third substrate are electrically connected in order,
   wherein the connector is disposed on the third substrate, and
   wherein the second substrate comprises a groove through which the connector penetrates.

15. A camera module comprising:
   a first body comprising a lens;
   a second body coupled to the first body;
   a substrate assembly disposed inside the second body; and
   a connector disposed on the substrate assembly,
   wherein the substrate assembly comprises:
      a first substrate disposed with an image sensor;
      a second substrate spaced apart from the first substrate and disposed with a processor;
      a third substrate spaced apart from the first and second substrates;
      a fourth substrate electrically connecting the first substrate and the second substrate; and
      a fifth substrate electrically connecting the second substrate and the third substrate,
   wherein the second substrate is disposed farther from the lens than the first and third substrates,
   wherein the first substrate, the fourth substrate, the second substrate, the fifth substrate, and the third substrate are electrically connected in order,
   wherein the connector is disposed on the third substrate, and
   wherein the second substrate comprises a groove through which the connector penetrates.

16. The camera module according to claim 15, wherein the second substrate is disposed at a lower position than the first and third substrates.

17. The camera module according to claim 15, wherein at least a portion of the connector is disposed at a position higher than the second substrate, and
   wherein the remaining portion of the connector is disposed at a position lower than the second substrate.

18. The camera module according to claim 15, wherein a distance between the first substrate and the second substrate in an optical axis direction is longer than a distance between the first substrate and the third substrate in the optical axis direction.

* * * * *